(12) United States Patent
Li et al.

(10) Patent No.: US 10,707,329 B2
(45) Date of Patent: Jul. 7, 2020

(54) VERTICAL FIN FIELD EFFECT TRANSISTOR DEVICE WITH REDUCED GATE VARIATION AND REDUCED CAPACITANCE

(71) Applicant: INTERNATIONAL BUSINESS MACHINES CORPORATION, Armonk, NY (US)

(72) Inventors: Juntao Li, Cohoes, NY (US); Kangguo Cheng, Schenectady, NY (US); Choonghyun Lee, Rensselaer, NY (US); Shogo Mochizuki, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/029,133

(22) Filed: Jul. 6, 2018

(65) Prior Publication Data

US 2020/0013879 A1 Jan. 9, 2020

(51) Int. Cl.
| | |
|---|---|
| *H01L 29/66* | (2006.01) |
| *H01L 29/08* | (2006.01) |
| *H01L 29/10* | (2006.01) |
| *H01L 21/8234* | (2006.01) |
| *H01L 29/78* | (2006.01) |
| *H01L 21/3065* | (2006.01) |

(52) U.S. Cl.
CPC .... *H01L 29/66666* (2013.01); *H01L 21/3065* (2013.01); *H01L 21/823412* (2013.01); *H01L 21/823487* (2013.01); *H01L 29/0847* (2013.01); *H01L 29/1037* (2013.01); *H01L 29/6653* (2013.01); *H01L 29/7827* (2013.01)

(58) Field of Classification Search
CPC ......... H01L 21/3065; H01L 21/823412; H01L 21/823431; H01L 21/823487; H01L 21/823821; H01L 21/845
See application file for complete search history.

(56) References Cited

U.S. PATENT DOCUMENTS

| | | |
|---|---|---|
| 9,627,511 B1 | 4/2017 | Cheng et al. |
| 9,647,123 B1 | 5/2017 | Balakrishnan et al. |

(Continued)

OTHER PUBLICATIONS

Kunz et al., "Reduction of Parasitic Capacitance in Vertical MOSFETs by Spacer Local Oxidation", IEEE Transactions on Electronic Devices. vol. 50. Issue No. 6. Jun. 2003. pp. 1487-1493.

(Continued)

*Primary Examiner* — Cuong Q Nguyen
(74) *Attorney, Agent, or Firm* — Tutunjian & Bitetto, P.C.; Vazken Alexanian

(57) ABSTRACT

A method of forming a fin field effect transistor device is provided. The method includes forming a vertical fin on a substrate, and depositing a sidewall liner on exposed surfaces of the vertical fin. The method further includes removing a portion of the substrate below the sidewall liner to form a support pillar below the vertical fin. The method further includes laterally etching the support pillar to form a thinned support pillar, and forming a bottom source/drain layer on the substrate and the thinned support pillar, wherein the bottom source/drain layer has a non-uniform thickness.

15 Claims, 7 Drawing Sheets

(56) References Cited

U.S. PATENT DOCUMENTS

| | | |
|---|---|---|
| 9,691,850 B2 | 6/2017 | Cheng et al. |
| 9,716,170 B1 | 7/2017 | Cheng et al. |
| 9,741,626 B1 | 8/2017 | Cheng et al. |
| 9,853,028 B1 | 12/2017 | Cheng et al. |
| 2013/0032876 A1 | 2/2013 | Cheng et al. |
| 2019/0006493 A1* | 1/2019 | Young ................. H01L 21/3065 |
| 2019/0027370 A1* | 1/2019 | Mulfinger ......... H01L 21/30604 |

OTHER PUBLICATIONS

Yakimets et al., "Vertical GAAFETs for the Ultimate CMOS Scaling", IEEE Transactions on Electron Devices. vol. 62. Issue No. 5. May 2015. pp. 1433-1439.

* cited by examiner

VERTICAL FIN FIELD EFFECT TRANSISTOR DEVICE WITH REDUCED GATE VARIATION AND REDUCED CAPACITANCE

BACKGROUND

Technical Field

The present invention generally relates to vertical fin field effect transistor devices, and more particularly to bottom spacers in vertical fin field effect transistor devices.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a metal-oxide-semiconductor field effect transistor (MOSFET) with a single gate parallel with the plane of the substrate. Depending on the doping of the source and drain, an NFET or a PFET can be formed. Two FETs also can be coupled to form a complementary metal oxide semiconductor (CMOS) device, where a p-type MOSFET and n-type MOSFET are coupled together.

SUMMARY

In accordance with an embodiment of the present invention, a method of forming a fin field effect transistor device is provided. The method includes forming a vertical fin on a substrate, and depositing a sidewall liner on exposed surfaces of the vertical fin. The method further includes removing a portion of the substrate below the sidewall liner to form a support pillar below the vertical fin. The method further includes laterally etching the support pillar to form a thinned support pillar, and forming a bottom source/drain layer on the substrate and the thinned support pillar, wherein the bottom source/drain layer has a non-uniform thickness.

In accordance with another embodiment of the present invention, a method of forming a fin field effect transistor device is provided. The method includes forming a vertical fin on a substrate, and depositing a sidewall liner on exposed surfaces of the vertical fin. The method further includes removing a portion of the substrate below the sidewall liner to form a support pillar below the vertical fin. The method further includes laterally etching the support pillar to form a thinned support pillar, and forming a bottom source/drain layer on the substrate and the thinned support pillar, wherein the bottom source/drain layer has a recessed dimple. The method further includes depositing a capping layer in the recessed dimple.

In accordance with yet another embodiment of the present invention, a fin field effect transistor device is provided. The fin field effect transistor device includes a vertical fin on a substrate, wherein the vertical fin has a doped extension region. The fin field effect transistor device further includes a thinned support pillar below the vertical fin and doped extension region, and a bottom source/drain layer on the substrate and the thinned support pillar, wherein the bottom source/drain layer has a recessed dimple. The fin field effect transistor device further includes a bottom spacer layer on the bottom source/drain layer, wherein the bottom spacer layer fills the recessed dimple.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a bottom spacer layer with a non-uniform thickness to control gate-to-source/drain overlap to reduce device capacitances. Forming a bottom spacer layer with a minimal thickness adjacent to a sidewall of a vertical fin reduces overlap variability and allows the gate dielectric layer and conductive gate fill to be formed as close as possible to the doped extension of the vertical fin.

Embodiments of the present invention provide a method of forming a bottom spacer layer with a non-uniform thickness using a capping layer that can be converted to the bottom spacer layer on a bottom source/drain layer having recessed dimples for the capping layer.

Exemplary applications/uses to which the present invention can be applied include, but are not limited to: logic devices (e.g., NAND gates, NOR gates, XOR gates, etc.) and memory devices (e.g., static random access memory (SRAM), dynamic random access memory (DRAM), etc.).

It is to be understood that aspects of the present invention will be described in terms of a given illustrative architecture; however, other architectures, structures, substrate materials and process features and steps can be varied within the scope of aspects of the present invention.

Figure 1:
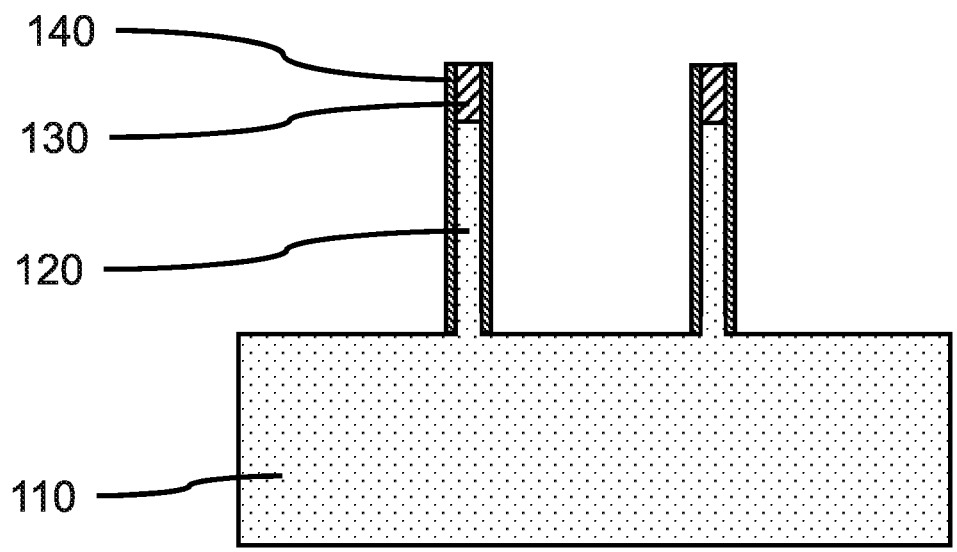
FIG. 1 is a cross-sectional side view showing a plurality of vertical fins on a substrate with sidewall liners on the vertical fins, in accordance with an embodiment of the present invention.

Referring now to the drawings in which like numerals represent the same or similar elements and initially to FIG. 1, a cross-sectional side view of a plurality of vertical fins on a substrate with sidewall liners on the vertical fins is shown, in accordance with an embodiment of the present invention.

In one or more embodiments, a plurality of vertical fins 120 can be formed on a substrate 110. The vertical fins 120 can be formed by patterning and etching processes, including sidewall image transfer (SIT), a self-aligned double patterning (SADP) process, self-aligned triple patterning (SATP) process, or a self-aligned quadruple patterning (SAQP). The vertical fins 120 may be formed by a direct write process or double patterning process using, for example, immersion lithography, extreme ultraviolet lithography, or x-ray lithography.

In various embodiments, the vertical fins 120 can have a width in a range of about 5 nanometers (nm) to about 30 nm, or about 6 nm to about 20 nm, or about 7 nm to about 12 nm, although other widths are also contemplated.

In various embodiments, a fin template 130 can be formed on each of the vertical fins 120 as part of the image transfer process, where the fin template 130 can be a hardmask made of a dielectric material selected from silicon oxide (SiO), silicon nitride (SiN), silicon oxynitride (SiON), silicon boronitride (SiBN), silicon boro carbonitride (SiBCN), silicon carbonitride (SiCN), silicon oxycarbonitride (SiOCN), and combinations thereof.

In one or more embodiments, a substrate 110 can be, for example, a single crystal semiconductor material wafer or a semiconductor-on-insulator stacked wafer. The substrate 110 can include a support layer that provides structural support, and a active semiconductor layer that can form devices. An insulating layer (e.g., a buried oxide (BOX) layer) may be between the active semiconductor layer and the support layer to form a semiconductor-on-insulator substrate (SeOI) (e.g., a silicon-on-insulator substrate (SOI)), or an implanted layer can form a buried insulating material.

The support layer can include crystalline, semi-crystalline, micro-crystalline, nano-crystalline, and/or amorphous phases. The support layer can be a semiconductor (e.g., silicon (Si), silicon carbide (SiC), silicon-germanium (SiGe), germanium (Ge), gallium-arsenide (GaAs), cadmium-telluride (CdTe), etc.), an insulator (e.g.: glass (e.g. silica, borosilicate glass), ceramic (e.g., aluminum oxide ($Al_2O_3$, sapphire), plastic (e.g., polycarbonate, polyacetonitrile), metal (e.g. aluminum, gold, titanium, molybdenum-copper (MoCu) composites, etc.), or combination thereof.

The substrate 110 or active semiconductor layer can be a crystalline semiconductor, for example, a IV or IV-IV semiconductor (e.g., silicon (Si), silicon carbide (SiC), silicon-germanium (SiGe), germanium (Ge)), a III-V semiconductor (e.g., gallium-arsenide (GaAs), indium-phosphide (InP), indium-antimonide (InSb)), a II-VI semiconductor (e.g., cadmium-telluride (CdTe), zinc-telluride (ZnTe), zinc sulfide (ZnS), zinc selenide (ZnSe)), or a IV-VI semiconductor (e.g., tin sulfide (SnS), lead selenide (PbSb)). The vertical fins 120 can be made of the same material as the substrate 110 or active semiconductor layer.

In one or more embodiments, a sidewall liner layer can be formed on the exposed surface of the substrate 110 and vertical fins 120, where the sidewall liner layer can be formed by a conformal deposition, for example, chemical vapor deposition (CVD), atomic layer deposition (ALD), plasma enhanced ALD (PEALD), or a combination thereof. Portions of the sidewall liner layer on the substrate surface and the top surface of the fin templates 130 can be removed using a selective, directional etch, for example a reactive ion etch (RIE), to leave sidewall liners 140 on each of the vertical fins 120, where the sidewall liners can wrap around the vertical fins.

In various embodiments, the sidewall liner layer and sidewall liners 140 can have a thickness in a range of about 2 nm to about 5 nm, or about 3 nm to about 4 nm, where the sidewall liners 140 can have a thickness sufficient to protect the vertical fins 120 from oxidizing.

In various embodiments, the sidewall liner layer and sidewall liners 140 can be a nitride dielectric material selected from silicon nitride (SiN), silicon boronitride (SiBN), silicon boro carbonitride (SiBCN), silicon carbonitride (SiCN), and combinations thereof, where the nitride dielectric material can provide an oxygen barrier at the deposited thickness.

Figure 2:
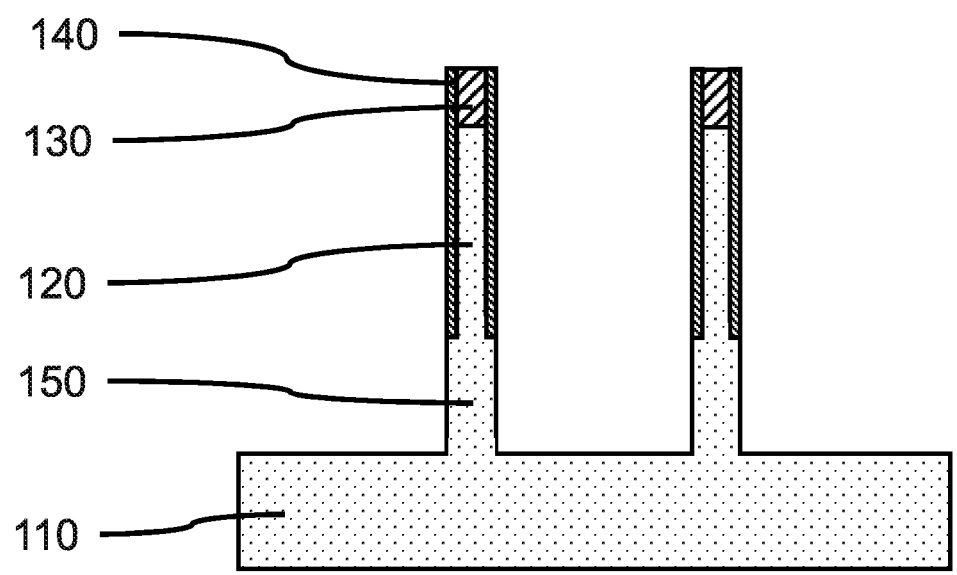
FIG. 2 is a cross-sectional side view showing support pillars under each of the vertical fins after etching back a portion of the substrate, in accordance with an embodiment of the present invention.

FIG. 2 is a cross-sectional side view showing support pillars under each of the vertical fins after etching back a portion of the substrate, in accordance with an embodiment of the present invention.

In one or more embodiments, a portion of the substrate 110 below the bottom of the vertical fins 120 and sidewall liners 140 can be removed, where the portion of the substrate 110 can be removed using a selective directional etch (e.g., RIE). In various embodiments, the substrate 110 can be removed to a depth of about 10 nm to about 50 nm, or about 20 nm to about 30 nm, although other depths are also contemplated. The vertical fins 120 and sidewall liners 140 can mask the underlying substrate, and removal of the exposed substrate material can form a support pillar 150 below each of the vertical fins 120. The support pillars 150 can have a width of about the vertical fin width plus twice the sidewall liner thickness, and a height equal to the depth of the substrate etch. The vertical fins 120, support pillars 150, and substrate 110 can all be the same semiconductor material.

Figure 3:
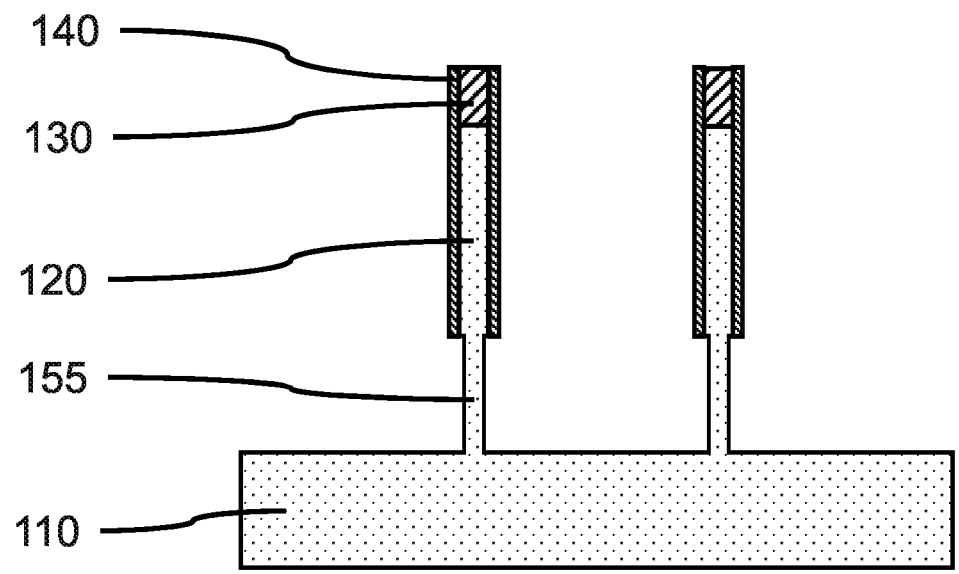
FIG. 3 is a cross-sectional side view showing thinned support pillars under each of the vertical fins after laterally etching the support pillars, in accordance with an embodiment of the present invention.

FIG. 3 is a cross-sectional side view showing thinned support pillars under each of the vertical fins after laterally etching the support pillars, in accordance with an embodiment of the present invention.

In one or more embodiments, the support pillars 150 can be thinned using a lateral etch that can selectively remove semiconductor material selective to the dielectric materials, such as the fin template 130 hardmask and sidewall liners 140 on the vertical fin sidewalls. In various embodiments, the etch can be an isotropic process such as plasma etch, gas phase etch (e.g., hydrogen chloride (HCl), or wet chemical etch. In various embodiments, a crystalline orientation dependent etch, for example, a wet chemical etch with ammonium hydroxide ($NH_3OH$) or tetramethyl ammonium hydroxide TMAH, that preferentially etches certain crystalline planes (e.g., {100} planes) faster than other crystalline planes (e.g., {111} planes), resulting in facetted recess profiles after etching, can be used.

In various embodiments, the support pillars 150 can be thinned by about 1 nm to about 10 nm, or about 2 nm to about 7 nm, or about 3 nm to about 5 nm, to form thinned support pillars 155, where the amount of the thickness removed can depend on the initial support pillar thickness.

The thinned support pillars 155 can have a width in a range of about 3 nanometers (nm) to about 25 nm, or about 3 nm to about 10 nm, or about 3 nm to about 6 nm, although other widths are also contemplated. The thinned support pillars 155 can have a width less than the width of the overlying vertical fin 120.

Figure 4:
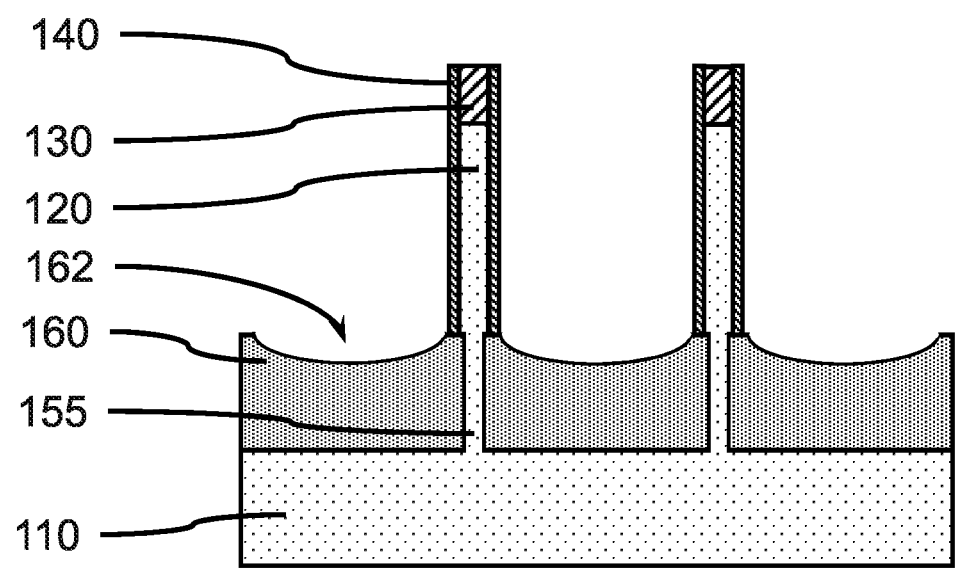
FIG. 4 is a cross-sectional side view showing a bottom source/drain layer formed on the substrate and thinned support pillars, in accordance with an embodiment of the present invention.

FIG. 4 is a cross-sectional side view showing a bottom source/drain layer formed on the substrate and thinned support pillars, in accordance with an embodiment of the present invention.

In one or more embodiments, a bottom source/drain layer 160 can be formed on the substrate 110 and thinned support pillars 155, where the bottom source/drain layer 160 can be formed by an epitaxial growth process. The bottom source/drain layer 160 can be epitaxially grown from the surface of the substrate 110 and/or the sidewalls of the vertical fins 120.

In various embodiments, the bottom source/drain layer 160 can be formed by an epitaxy-etch, epitaxy-etch process to produce a non-uniform thickness. The sidewall liners 140 can mask the underlying portion of the bottom source/drain layer 160, such that the bottom source/drain layer 160 remains unetched from a directional etch (e.g., RIE) under the sidewall liners 140, and has a maximum thickness below the sidewall liners.

In various embodiments, the bottom source/drain layer 160 can have a non-uniform thickness, where recessed dimples 162 can be formed in the upper surface of the bottom source/drain layer 160 through controlled undergrowth of the bottom source/drain layer, and/or directional recess etching. The bottom source/drain layer 160 can have a maximum thickness adjoining the vertical fin sidewalls, and a minimum thickness at about a middle point between adjacent vertical fins 120. The minimum thickness can be within the recessed dimples 162.

In various embodiments, the bottom source/drain layer 160 can have a maximum thickness adjoining the vertical fin sidewalls equal to the depth of the substrate removal process, where the bottom source/drain layer 160 can have the maximum thickness for a width extending away from the thinned support pillars 155 equal to or greater than the thinned amount of the support pillar 150 and the thickness of the sidewall liner 140. The bottom source/drain layer 160 can extend a distance from the sidewalls of the thinned support pillars 155, such that there is an intervening region of the bottom source/drain layer 160 between the thinned support pillars and the closest edge of the recessed dimples 162. The bottom source/drain layer 160 can have a minimum thickness of about 5 nm to about 20 nm, or about 10 nm to about 15 nm, less than the maximum thickness. The top surface of the bottom source/drain layer 160 can be below the bottom edges of the sidewall liners 140 to provide space for the subsequent formation of a capping layer. The bottom source/drain layer 160 can cover the sidewalls of the thinned support pillars 155.

The bottom source/drain layer 160 can be a crystalline semiconductor material, including, but not limited to, silicon (Si), silicon carbide (SiC), silicon-germanium (SiGe), and germanium (Ge), that can include a dopant. The dopant can be an n-type dopant (e.g., phosphorus (P), arsenic (As)) or p-type dopant (e.g., boron (B), gallium (Ga)). The dopant can be introduced into the bottom source/drain layer 160 during formation (i.e., in situ) and/or after formation (i.e., ex situ), for example, ion implantation, plasma doping, gas phase doping, solid phase doping, liquid phase doping. The bottom source/drain layer 160 can provide dopants for diffusion into a lower portion of the vertical fins 120 and into the thinned support pillars 155, where the bottom source/drain layer can have an initial dopant concentration in a range of about $1 \times 10^{20}$ $cm^{-3}$ to about $2 \times 10^{21}$ $cm^{-3}$.

Figure 5:
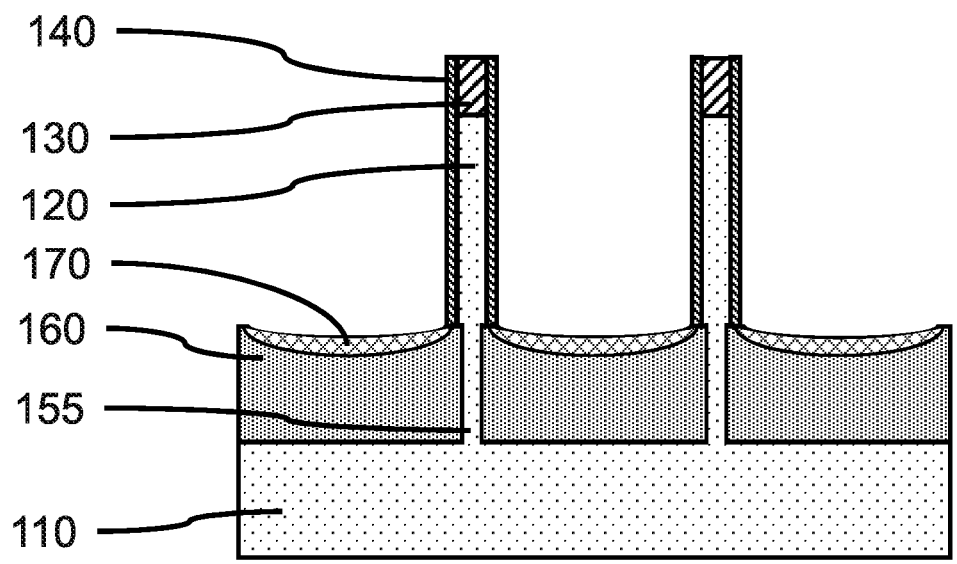
FIG. 5 is a cross-sectional side view showing a capping layer formed on the bottom source/drain layer, in accordance with an embodiment of the present invention.

FIG. 5 is a cross-sectional side view showing a capping layer formed on the bottom source/drain layer, in accordance with an embodiment of the present invention.

In one or more embodiments, a capping layer 170 can be formed on the bottom source/drain layer 160, where the capping layer 170 can be formed by epitaxial growth on the bottom source/drain layer 160. The formation of the capping layer 170 can be controlled to avoid overgrowth proximal to the sidewall liner 140, while filing in at least a portion of the recessed dimples 162 to reduce the difference in height between the maximum thickness and minimum thickness. The capping layer 170 can have a non-uniform thickness, with a greater thickness at a middle point between adjacent vertical fins 120. The capping layer 170 can have essentially a lune shape (i.e., a concave-convex shape), where the ends can be curved.

In various embodiments, the capping layer 170 can have a maximum thickness of about 5 nm to about 15 nm, where the maximum thickness can be less than the height from the middle point of the exposed surface of the bottom source/drain layer 160 to the bottom surface of the sidewall liner 140. A portion of the capping layer 170 can be formed below the sidewall liners 140 due to lateral etching of the bottom source/drain layer 160. A region of the bottom source/drain layer 160 can be between an end of the capping layer 170 and the sidewall of the vertical fin 120 and thinned support pillars 155, where the capping layer 170 does not come into contact with the vertical fin 120 or thinned support pillars 155.

In various embodiments, the capping layer 170 can be silicon-germanium, wherein the germanium concentration can be in a range of about 40 atomic percent (at. %) to about 60 at. %, or about 50 at. %, although other germanium concentrations are also contemplated.

Figure 6:
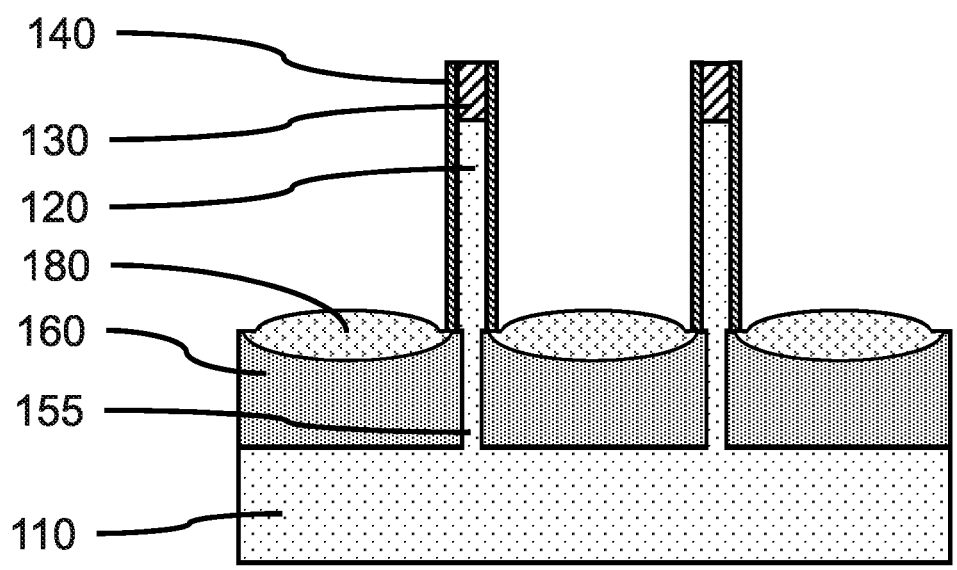
FIG. 6 is a cross-sectional side view showing the capping layer converted to a bottom spacer layer on the bottom source/drain layer, in accordance with an embodiment of the present invention.

FIG. 6 is a cross-sectional side view showing the capping layer converted to a bottom spacer layer on the bottom source/drain layer, in accordance with an embodiment of the present invention.

In one or more embodiments, the capping layer 170 can be converted to a bottom spacer layer 180 on the bottom source/drain layer 160, where the capping layer 170 can be converted by a chemical reaction with a reactant. The conversion process can be a low temperature oxidation using an oxidizing agent, as the reactant. In various embodiments, the oxidizing agent can be an oxidizing species, for example, oxygen gas ($O_2$), water ($H_2O$), ozone ($O_3$), oxygen plasma, oxygen radicals, a mixture of hydrogen ($H_2$) gas and oxygen ($O_2$) gas, and combinations thereof.

In various embodiments, the low temperature oxidation can be conducted at a temperature in a range of about 300° C. to about 800° C., or about 500° C. to about 600° C., although other temperatures are also contemplated. The low temperature oxidation can be conducted for about 10 seconds (sec) to about 600 sec, or about 100 sec to about 300 sec.

In various embodiments, the bottom spacer layer 180 can be a semiconductor oxide, for example, silicon oxide (SiO), where the silicon oxide (SiO) can be formed by low temperature oxidation of a silicon-germanium (SiGe) capping layer 170. The germanium (Ge) can vaporize as germanium monoxide (GeO).

In various embodiments, the bottom spacer layer 180 can have a non-uniform thickness, where the bottom spacer layer 180 can have a minimum thickness adjacent to and/or under the sidewall liners 140, and a maximum thickness at about the minimum thickness of the bottom source/drain layer 160. The bottom spacer layer 180 can have essentially a tapered lens shape (i.e., a biconvex shape), where the lens shape can be an asymmetrical lens shape (the upper convex surface has a different radius of curvature than the lower convex surface). The bottom spacer layer 180 can have flat portions of the upper surface under the sidewall liners 140.

In various embodiments, the bottom spacer layer 180 can have a maximum thickness of about 5 nm to about 15 nm.

Figure 7:
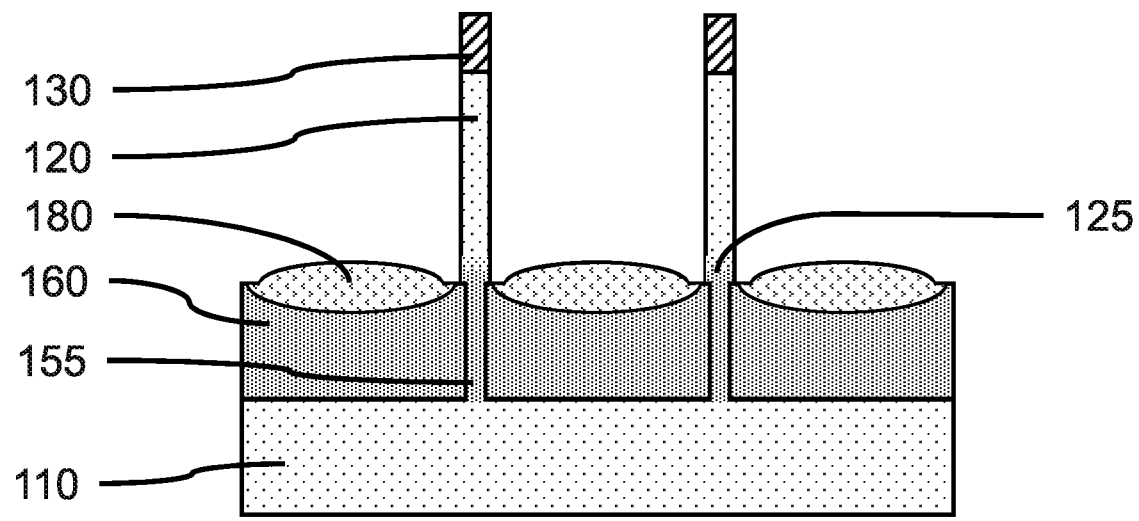
FIG. 7 is a cross-sectional side view showing the sidewall liners removed from the vertical fins, in accordance with an embodiment of the present invention.

FIG. 7 is a cross-sectional side view showing the sidewall liners removed from the vertical fins, in accordance with an embodiment of the present invention.

In one or more embodiments, the bottom source/drain layer 160, thinned support pillars 155, vertical fins 120, fin templates 130, and sidewall liners 140 can be heat treated to diffuse dopants from the bottom source/drain layer 160 into the thinned support pillars 155, and a lower portion of the vertical fins 120 to form doped extension regions 125. The heat treatment can be performed by a thermal annealing process, including but not limited to, rapid thermal anneal, spike anneal, flash anneal, laser anneal, or any suitable combination of annealing processes.

In various embodiments, the doped extension regions 125 can extend a height in the range of about 2 nm to about 8 nm, or about 3 nm to about 6 nm into the lower portion of each vertical fin 120, where the height and concentration gradient of the doped extension regions 125 can depend on the time and temperature of the diffusion heat treatment. The top end of the doped extension regions 125 can be defined as the height at which the dopant concentration is at least $1 \times 10^{19}$/cm$^3$. Portion of the vertical fin 120 above the doped extension regions 125 can have a dopant concentration of about $1 \times 10^{18}$/cm$^3$, and a middle portion of the vertical fin 120 can be an intrinsic semiconductor.

In one or more embodiments, the sidewall liners 140 can be removed from the vertical fins 120, where the sidewall liners 140 can be removed using a selective, isotropic etch, for example, a wet chemical etch or dry plasma etch. Removal of the sidewall liners 140 can expose the vertical fin sidewalls. Portions of the bottom spacer layer 180 and bottom source/drain layer 160 that where formed under the sidewall liners 140 can be expose by removal of the sidewall liners 140.

Figure 8:
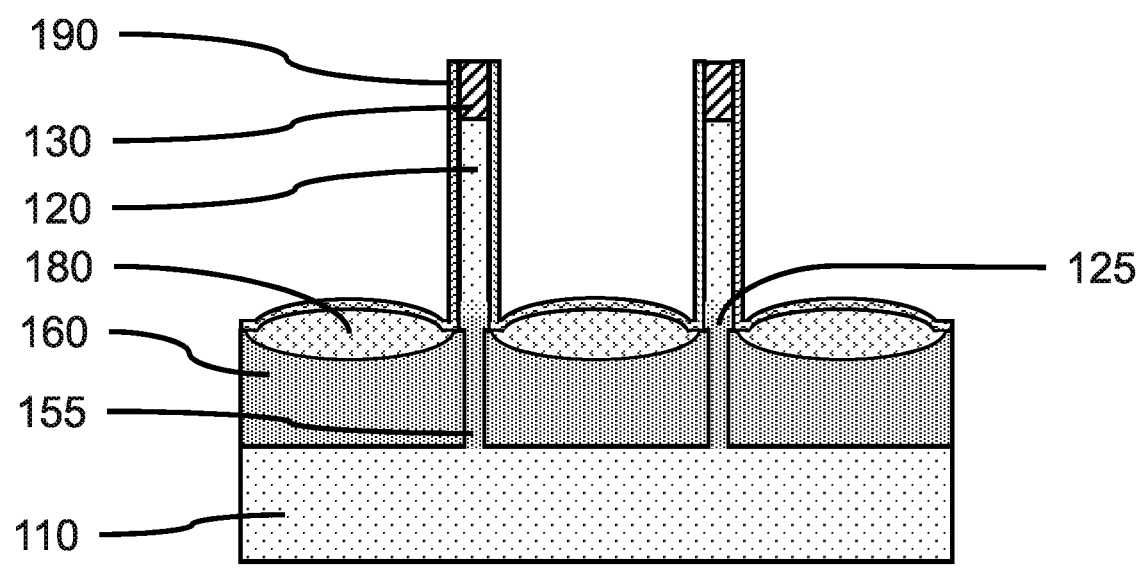
FIG. 8 is a cross-sectional side view showing a gate dielectric layer formed on the vertical fins and bottom spacer layer, in accordance with an embodiment of the present invention.

FIG. 8 is a cross-sectional side view showing a gate dielectric layer formed on the vertical fins and bottom spacer layer, in accordance with an embodiment of the present invention.

In one or more embodiments, a gate dielectric layer 190 can be formed on the exposed surfaces of the vertical fins 120, fin template 130, bottom source/drain layer 160, and bottom spacer layer 180, where the gate dielectric layer 190 can be formed by a conformal deposition, for example, chemical vapor deposition (CVD), atomic layer deposition (ALD), plasma enhanced ALD (PEALD), or a combination thereof. The gate dielectric layer 190 can be formed on the convex surface of the bottom spacer layer 180, and flat surface previously under the sidewall liners 140.

In various embodiments, the gate dielectric layer 190 can be a dielectric material, including, but not limited to, silicon oxide (SiO), silicon nitride (SiN), silicon oxynitride (SiON), silicon boronitride (SiBN), silicon boro carbonitride (SiBCN), silicon carbonitride (SiCN), silicon oxycarbonitride (SiOCN), a high-k dielectric, and combinations thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In various embodiments, the gate dielectric layer 190 can have a thickness in a range of about 1 nm to about 5 nm, or about 1.5 nm to about 3 nm, although other thicknesses are also contemplated. The thickness of the gate dielectric layer 190 can be less than or equal to the distance between the proximal edge of the bottom spacer layer 180 and the thinned support pillars 155. A portion of the gate dielectric layer 190 can be formed on the exposed portion of the bottom source/drain layer 160 adjacent to the thinned support pillars 155.

Figure 9:
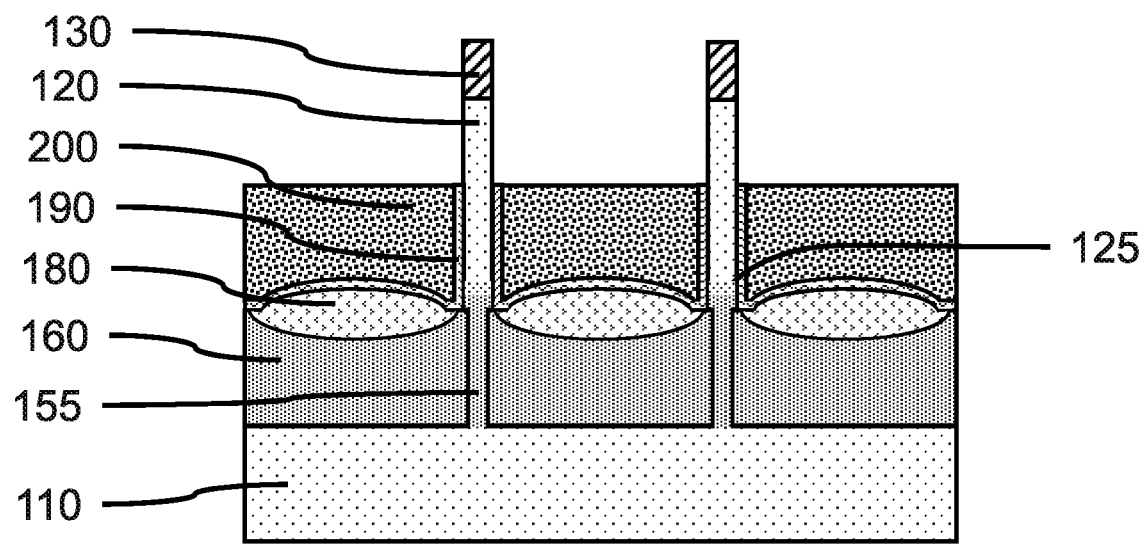
FIG. 9 is a cross-sectional side view showing a conductive gate fill on the gate dielectric layer, in accordance with an embodiment of the present invention.

FIG. 9 is a cross-sectional side view showing a conductive gate fill on the gate dielectric layer, in accordance with an embodiment of the present invention.

In one or more embodiments, a conductive gate fill 200 can be formed on the gate dielectric layer 190, where the conductive gate fill 200 can be formed by a blanket deposition, for example, chemical vapor deposition (CVD), plasma enhanced CVD (PECVD), metal organic CVD (MOCVD), and combinations thereof. The conductive gate fill 200 can cover the gate dielectric layer 190, vertical fins 120 and fin templates 130, and conductive gate fill that extends above the fin templates can be removed using a chemical-mechanical polishing (CMP). The height of the conductive gate fill 200 can be reduced to below the bottom surface of the fin templates 130 using a selective etch, for example, a selective isotropic etch (e.g., wet chemical etch) or a directional etch (e.g., RIE). Removal of a portion of the conductive gate fill 200 can expose a portion of the gate dielectric layer 190 on the vertical fins 120 and fin templates 130. The exposed portion of the gate dielectric layer 190 can be removed using a selective isotropic etch (e.g., wet chemical etch) to expose the underlying portion of the vertical fins 120.

The conductive gate fill 200 can be any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, carbon nanotube, conductive carbon, graphene, or any suitable combination of these materials. The conductive material may further comprise dopants that are incorporated during or after deposition. In some embodiments, the gate may further comprise a work function setting layer between the gate dielectric and gate conductor. The work function setting layer can be a work function metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

Figure 10:
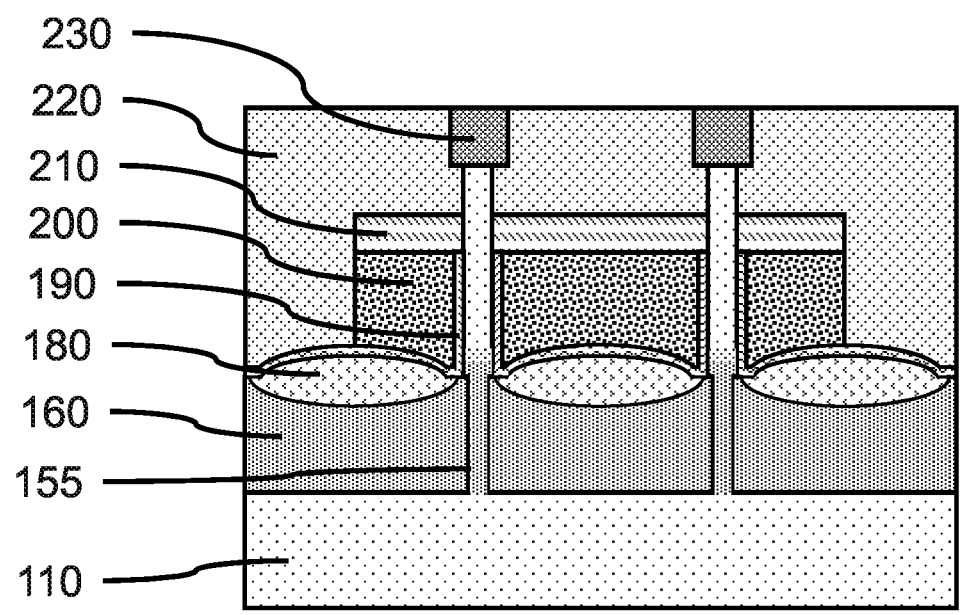
FIG. 10 is a cross-sectional side view showing a gate structure with a top spacer layer formed on each of the vertical fins, and a top source/drain on each of the vertical fins, in accordance with an embodiment of the present invention.

FIG. 10 is a cross-sectional side view showing a gate structure with a top spacer layer formed on each of the vertical fins, and a top source/drain on each of the vertical fins, in accordance with an embodiment of the present invention.

In various embodiments, a top spacer layer 210 can be formed on the conductive gate fill 200, where the top spacer layer 210 can be formed by a directional deposition, for example, gas cluster ion beam (GCIB) or high density plasma (HDP), or by spin-on and etch-back.

In various embodiments, the top spacer layer 210 can be silicon oxide (SiO), silicon nitride (SiN), silicon oxynitride (SiON), silicon boronitride (SiBN), silicon boro carbonitride (SiBCN), silicon carbonitride (SiCN), silicon oxycarbonitride (SiOCN), a low-k dielectric, and combinations thereof. A low-k dielectric can include, but not be limited to, carbon doped silicon oxide (SiO:C), fluorine doped silicon oxide (SiO:F), polymeric material, for example, tetraethyl orthosilicate (TEOS), hydrogen silsesquioxane (HSQ) and methylsilsesquioxane (MSQ), and combinations thereof.

In one or more embodiments, portions of the top spacer layer 210 and underlying conductive gate fill 200 can be removed through patterning and etching to form gate structures on the vertical fins 120. A portion of the gate dielectric layer 190 on the bottom spacer layer 180 can be exposed by removal of the portions of the conductive gate fill 200.

In one or more embodiments, an interlayer dielectric (ILD) layer 220 can be formed on the top spacer layer 210, gate dielectric layer 190, and conductive gate fill 200. The interlayer dielectric (ILD) layer 220 can be formed by a blanket deposition (e.g., CVD, spin-on). Portions of the interlayer dielectric (ILD) layer 220 deposited on and/or extending above the top surface of the fin templates 130 can be removed using a chemical-mechanical polishing (CMP) to provide a smooth, flat surface for subsequent processing.

In various embodiments, the fin templates 130 can be removed using a selective etch to expose the top surfaces of the vertical fins 120.

In one or more embodiments, top source/drains 230 can be formed on the top surfaces of the vertical fins 120, where the top source/drains 230 can be formed by epitaxial growth on each of the vertical fins 120. The top source/drains 230 can be doped semiconductor material, where the top source/drains 230 can be the same semiconductor material and have the same dopant type as the bottom source/drain layer 160.

The gate-to-doped extension region overlap capacitance can depend on the height of the doped extension regions 125 and the thickness of the gate dielectric layer 190, where the overlap of the conductive gate fill 200 with the doped extension regions 125 can affect the capacitance. The thinner portion of the lens-shaped bottom spacer layer 180 can improve junction gradience and reduce extension resistance. The thinner portion of the lens-shaped bottom spacer layer 180 can also reduces the transistor variability due to the variation of bottom spacer thickness and positioning of the gate structure. Meanwhile, the thicker portion of the lune-shape bottom spacer can reduce the parasitic gate-to-bottom source/drain capacitance. The reduction in extension resistance and reduction in parasitic capacitance improves the transistor performance and reduces the power consumption.

Figure 11:
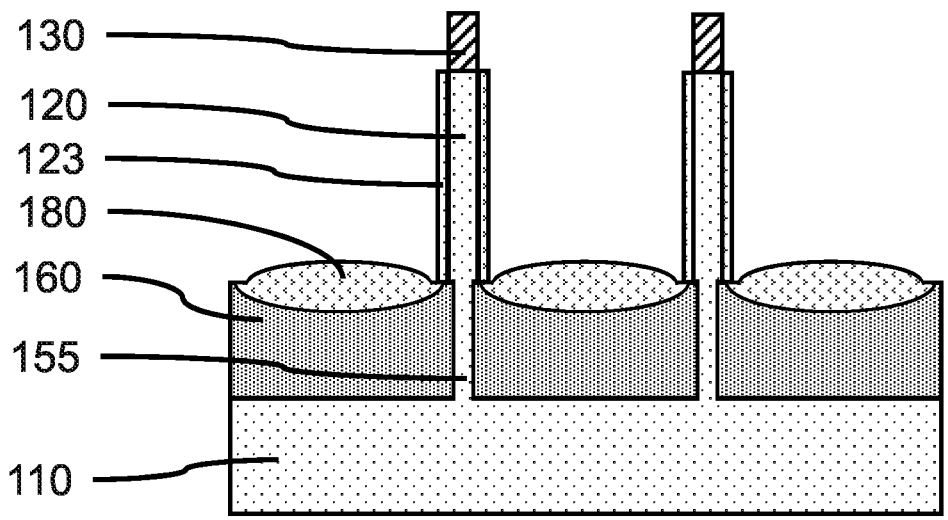
FIG. 11 is a cross-sectional side view showing the capping layer converted to a bottom spacer layer on the bottom source/drain layer, and a sacrificial layer on the vertical fins, in accordance with another embodiment of the present invention.

FIG. 11 is a cross-sectional side view showing the capping layer converted to a bottom spacer layer on the bottom source/drain layer, and a sacrificial layer on the vertical fins, in accordance with another embodiment of the present invention.

In other embodiments, the sidewall liners 140 on each of the vertical fins 120 can be removed using a selective etch prior to converting the capping layer 170 to a bottom spacer layer 180, for example, using a low temperature oxidation of the capping layer 170. The low temperature oxidation of the capping layer 170 can form a sacrificial layer 123, for example, a semiconductor oxide, on the exposed surfaces of the vertical fins 120, where the sacrificial layer 123 is much thinner than the oxide bottom spacer layer 180 formed on top of the bottom source/drain layer 160. In various embodiments, the sacrificial layer 123 may be less than 2 nm, or less than 1 nm on the vertical fins 120.

Figure 12:
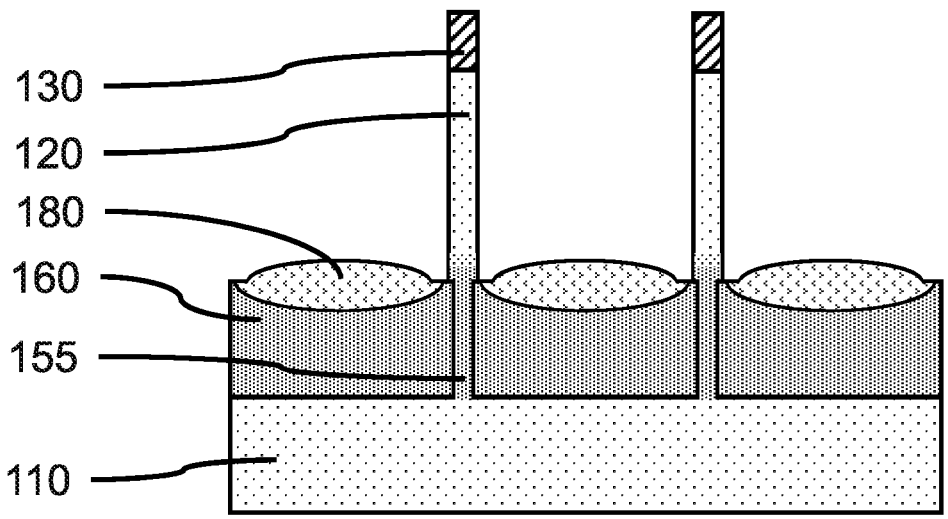
FIG. 12 is a cross-sectional side view showing the bottom spacer layer on the bottom source/drain layer after removing the sacrificial layer from the vertical fins, in accordance with another embodiment of the present invention.

FIG. 12 is a cross-sectional side view showing the bottom spacer layer on the bottom source/drain layer after removing the sacrificial layer from the vertical fins, in accordance with another embodiment of the present invention.

In one or more embodiments, the sacrificial layer 123 can be removed using a selective etch (e.g., wet chemical etch, dry plasma etch) to expose the vertical fins 120 and bottom source/drain layer 160.

Figure 13:
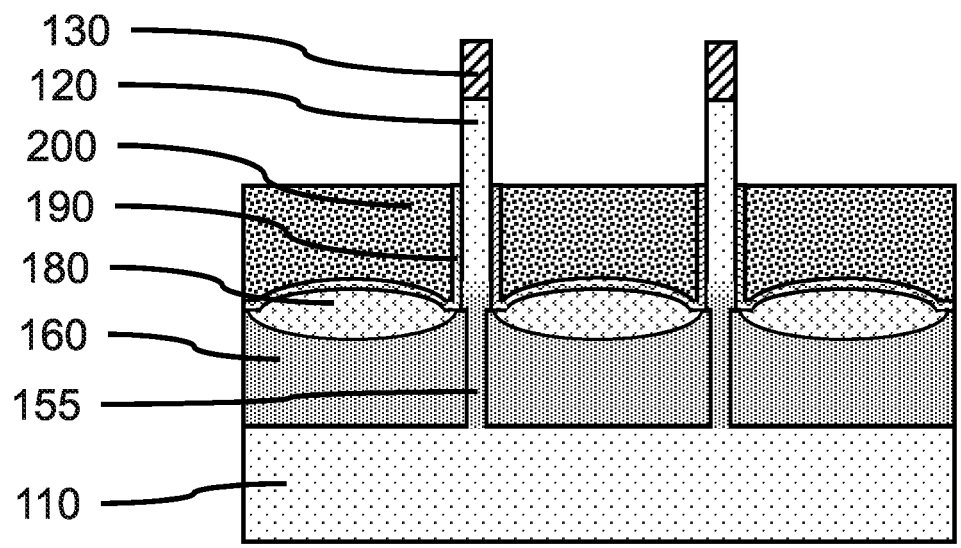
FIG. 13 is a cross-sectional side view showing a conductive gate fill on a gate dielectric layer, in accordance with another embodiment of the present invention.

FIG. 13 is a cross-sectional side view showing a conductive gate fill on a gate dielectric layer, in accordance with another embodiment of the present invention.

In various embodiments, the conductive gate fill 200 and gate dielectric layer 190 can be formed on the bottom spacer layer 180 and vertical fins 120.

Figure 14:
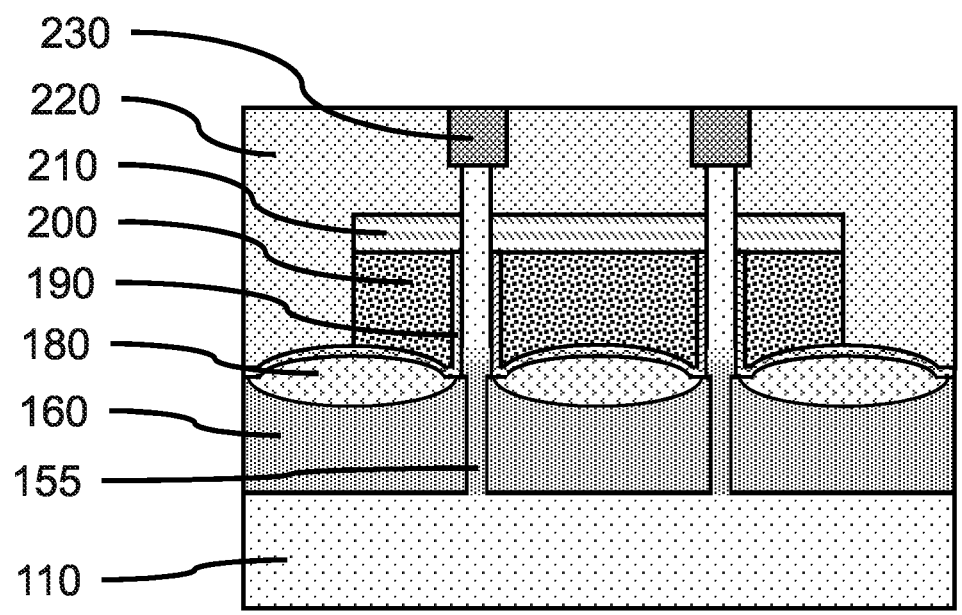
FIG. 14 is a cross-sectional side view showing a gate structure with a top spacer layer formed on each of the vertical fins, and a top source/drain on each of the vertical fins, in accordance with another embodiment of the present invention.

FIG. 14 is a cross-sectional side view showing a gate structure with a top spacer layer formed on each of the vertical fins, and a top source/drain on each of the vertical fins, in accordance with another embodiment of the present invention.

In one or more embodiments, a top spacer layer 210 can be formed on the conductive gate fill 200. Portions of the top spacer layer 210 and underlying conductive gate fill 200 can be removed through patterning and etching to form gate structures on the vertical fins 120. An interlayer dielectric (ILD) layer 220 can be formed on the top spacer layer 210 and conductive gate fill 200. The fin templates 130 can be removed using a selective etch to expose the top surfaces of the vertical fins 120, and top source/drains 230 can be formed on the top surfaces of the vertical fins 120.

It will be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations. elements and/or components, but do not preclude the presence or addition of one or more other features, integers, steps, operations, elements, components and/or groups thereof.

Spatially relative terms, such as "beneath," "below" "lower," "above," "upper." and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and method of fabricating a device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a fin field effect transistor device, comprising:
    forming a vertical fin on a semiconductor substrate, wherein the vertical fin is the same material as the semiconductor substrate;
    depositing a sidewall liner on exposed surfaces of the vertical fin;
    removing a portion of the substrate below the sidewall liner to form a support pillar below the vertical fin;
    laterally etching the support pillar to form a thinned support pillar; and
    forming a bottom source/drain layer on the substrate and the thinned support pillar, wherein the bottom source/drain layer has a non-uniform thickness.

2. The method of claim 1, further comprising depositing a capping layer on the bottom source/drain layer.

3. The method of claim 2, further comprising converting the capping layer to a bottom spacer layer.

4. The method of claim 3, wherein the capping layer is converted to the bottom spacer layer through exposure to an oxidizing agent at a temperature in a range of about 400° C. to about 800° C.

5. The method of claim 3, wherein the capping layer is silicon-germanium.

6. The method of claim 5, wherein the capping layer has a germanium concentration in a range of about 40 atomic percent (at. %) to about 60 at. %.

7. The method of claim 3, further comprising removing the sidewall liner, and forming a gate dielectric layer on the vertical fin, bottom spacer layer, and bottom source/drain layer.

8. The method of claim 7, wherein the gate dielectric layer has a thickness less than or equal to the distance between a proximal edge of the bottom spacer layer and the thinned support pillar.

9. The method of claim 7, further comprising forming a conductive gate fill on the gate dielectric layer, and forming a top spacer layer on the conductive gate fill.

10. A method of forming a fin field effect transistor device, comprising:
    forming a vertical fin on a substrate;
    depositing a sidewall liner on exposed surfaces of the vertical fin;
    removing a portion of the substrate below the sidewall liner to form a support pillar below the vertical fin;
    laterally etching the support pillar to form a thinned support pillar;
    forming a bottom source/drain layer on the substrate and the thinned support pillar, wherein the bottom source/drain layer has a recessed dimple; and
    depositing a capping layer in the recessed dimple.

11. The method of claim 10, wherein the capping layer has a lune shape.

12. The method of claim 10, wherein the thinned support pillar has a width in a range of about 3 nm to about 6 nm.

13. The method of claim 10, further comprising converting the capping layer to a bottom spacer layer, wherein the bottom spacer layer has a lens shape.

14. The method of claim 10, wherein the capping layer is silicon-germanium with a germanium concentration in a range of about 40 atomic percent (at. %) to about 60 at. %.

15. The method of claim 14, wherein the capping layer is converted to the bottom spacer layer through exposure to an oxidizing agent at a temperature in a range of about 400° C. to about 800° C.

* * * * *